United States Patent
Sugasawara et al.

[19]

[11] Patent Number: 6,101,458
[45] Date of Patent: Aug. 8, 2000

[54] AUTOMATIC RANGING APPARATUS AND METHOD FOR PRECISE INTEGRATED CIRCUIT CURRENT MEASUREMENTS

[75] Inventors: Emery Sugasawara, Pleasanton; V. Swamy Irrinki, Milpitas; Sudhakar R. Gouravaram, Fremont, all of Calif.

[73] Assignee: LSI Logic, Milpitas, Calif.

[21] Appl. No.: 08/961,163

[22] Filed: Oct. 30, 1997

[51] Int. Cl.[7] .................................................. G01R 27/00
[52] U.S. Cl. .......................... 702/119; 702/117; 324/763; 324/765; 714/734
[58] Field of Search .................................. 702/119, 129, 702/121, 122, 123, 117, 118; 714/700, 724, 734, 721; 324/763, 765

[56] References Cited

U.S. PATENT DOCUMENTS

| | | | |
|---|---|---|---|
| 4,517,512 | 5/1985 | Petrich et al. ............................ | 714/724 |
| 4,523,312 | 6/1985 | Takeuchi ................................. | 714/736 |
| 4,646,299 | 2/1987 | Schinabeck et al. .................... | 702/120 |
| 5,773,990 | 6/1998 | Wilstrup et al. ......................... | 324/765 |
| 5,917,331 | 6/1999 | Persons ................................... | 324/765 |

*Primary Examiner*—Marc S. Hoff
*Assistant Examiner*—Bryan Bui
*Attorney, Agent, or Firm*—Westerman, Champlin & Kelly, P.A.

[57] ABSTRACT

A computer-based test method and apparatus for measuring DC current drawn by an integrated circuit. The apparatus has a plurality of current measurement ranges and is first initialized to a selected one of the measurement ranges. Next, the apparatus measures the DC current drawn by the integrated circuit in the selected measurement range and increments the selected measurement range if the measured DC current is out of the selected measurement range. The apparatus repeats the steps of measuring and incrementing until the measured DC current is in the selected measurement range. The measured DC current is then compared to a specification limit for the integrated circuit.

16 Claims, 2 Drawing Sheets

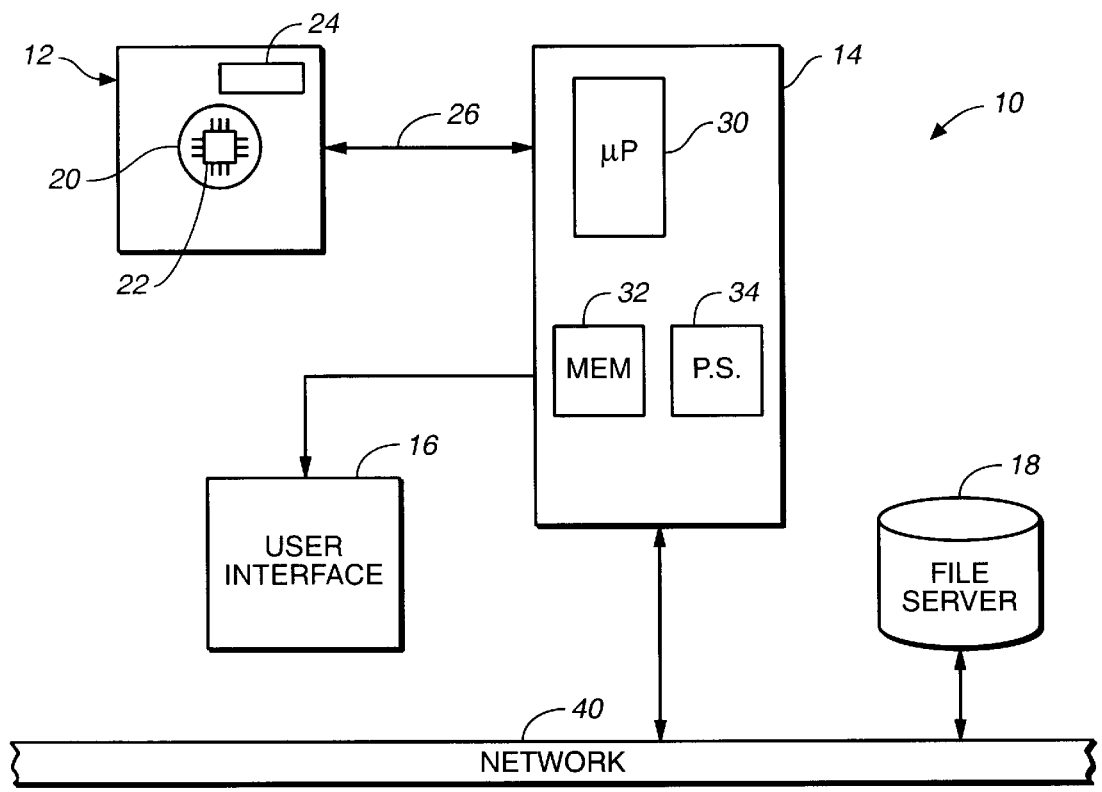

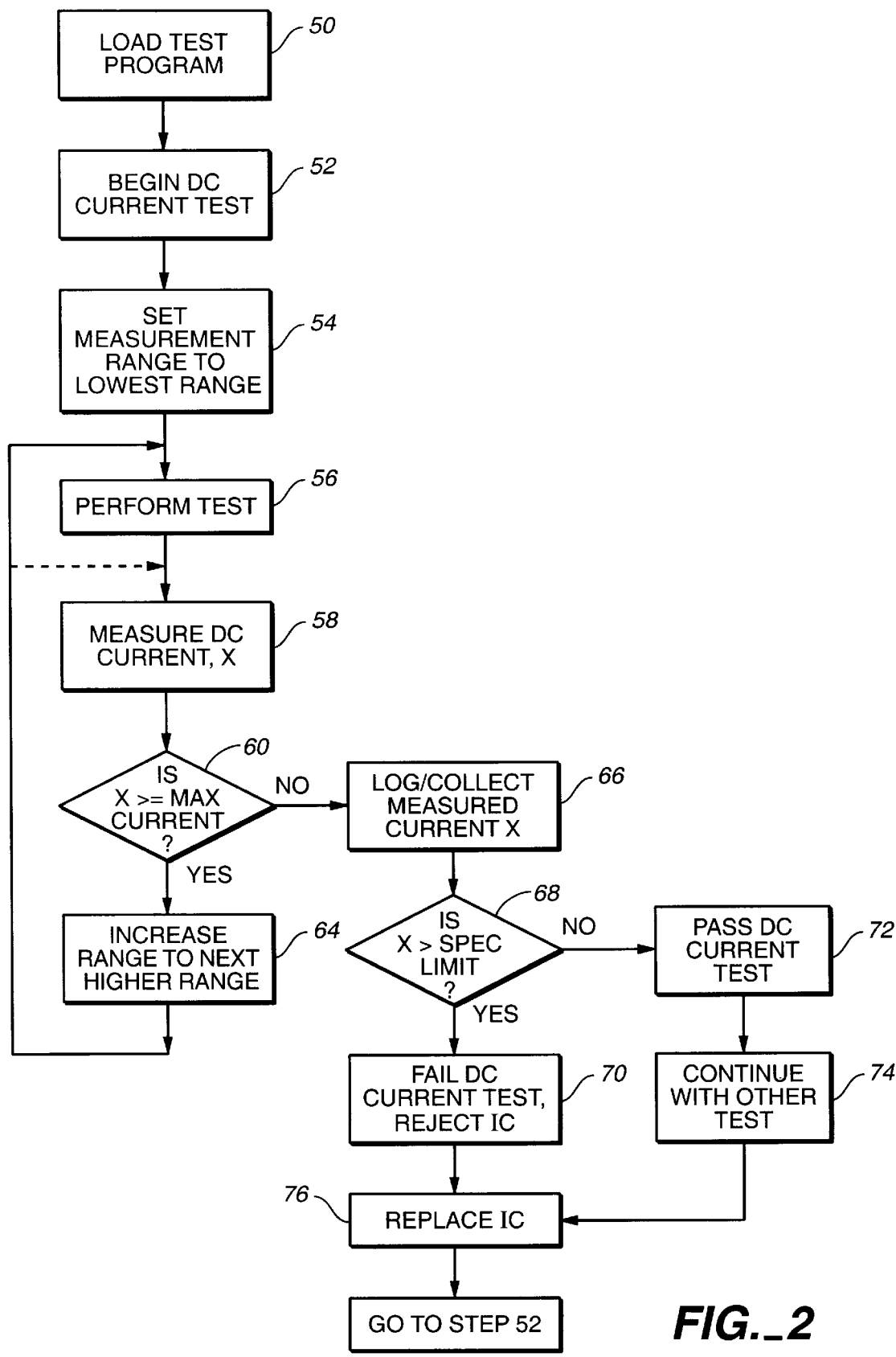
FIG._2

AUTOMATIC RANGING APPARATUS AND METHOD FOR PRECISE INTEGRATED CIRCUIT CURRENT MEASUREMENTS

BACKGROUND OF THE INVENTION

The present invention relates to DC current testing of integrated circuits and, more particularly, to a computer-based test apparatus and method.

After an integrated circuit is fabricated, several tests are performed on the integrated circuit to verify its functionality and performance. One of the tests commonly performed on an integrated circuit is a DC current test. During DC current testing, the integrated circuit is coupled to a tester which applies a voltage across the power supply pads of the integrated circuit and then measures the DC current drawn through the power supply pads. The integrated circuit is typically conditioned before making the current measurement by applying a set of test vectors to the input-output (IO) pads of the integrated circuit. These test vectors place the integrated circuit in a quiescent mode in which all sources of DC current in the integrated circuit are turned off. If the measured current exceeds a specified tolerance, there may be a short or some other fault condition in the integrated circuit. This test is typically run as a pass/fail test. Integrated circuits that fail the test are labeled to indicate the failure. Integrated circuits that pass the test are evaluated further with other test procedures.

DC current testing is typically automated to some degree by using a computer-based test apparatus. The test sequence and test vectors are contained in a software program that is run by the tester. The test engineer loads the test program into local memory and then enters an expected measurement range for the tester. This measurement range reflects the current level that the test engineer expects to be drawn by the integrated circuit being tested. For example, if the engineer expects that the integrated circuit will draw about 35 $\mu$A, the test engineer may select a measurement range of 0–100 $\mu$A. The test engineer then compiles the test program with the selected measurement range on the tester, and initiates the test sequence. The tester measures the DC current and provides an output indicative of whether the measured DC current is above or below the tolerance level. For example, the test apparatus may light a green light or a red light to indicate whether the integrated circuit has passed or failed the test. The integrated circuit is then removed and replaced with the next integrated circuit to be tested.

This test procedure is relatively accurate and efficient for a simple pass/fail test but is relatively inaccurate and inefficient for obtaining the actual value of the current that is drawn by the integrated circuit. For example, if the integrated circuit draws 5 mA instead of 35 $\mu$A and the tester is set to the 0–100 $\mu$A range, the tester may simply output the maximum current in the range or may generate some other "out of range" signal. The test engineer must then modify the test program to increase the measurement range, recompile the test program and re-run the test sequence. This process may need to be repeated several times until the correct measurement range is selected. As a result, this test procedure is very time consuming and inefficient if a large number of integrated circuits are tested and precise current measurements are required.

SUMMARY OF THE INVENTION

One aspect of the present invention relates to a method of measuring the DC current drawn by an integrated circuit. The method includes: coupling the integrated circuit to a computer-based test apparatus which has a plurality of current measurement ranges; initializing the computer-based test apparatus to a selected measurement range in the plurality of measurement ranges; measuring the DC current drawn by the integrated circuit with the computer-based test apparatus in the selected measurement range; incrementing the selected measurement range if the measured DC current is out of the selected measurement range; and repeating the steps of measuring and incrementing until the measured DC current is in the selected measurement range.

In one embodiment, the measured DC current is logged when the measured DC current is in the selected measurement range and then compared to a specification limit. The test apparatus generates an output signal which is indicative of the comparison.

Another aspect of the present invention relates to a computer-based DC current test apparatus which includes a test head, a DC current measurement circuit, a processor, a storage device and a software program. The test apparatus has a receptacle for electrically coupling to an integrated circuit. The DC current measurement circuit is electrically coupled to the test head and has plurality of measurement ranges. The processor is electrically coupled to the DC current measurement circuit, and the storage device is electrically coupled to the processor. A software program is stored in the storage device and is operative on the processor for: initializing the DC current measurement circuit to a selected measurement range in the plurality of measurement ranges; measuring the DC current drawn by the integrated circuit with the DC current measurement circuit in the selected measurement range; incrementing the selected measurement range if the measured DC current is out of the selected measurement range; and repeating the steps of measuring and incrementing until the measured DC current is in the selected measurement range.

BRIEF DESCRIPTION OF THE DRAWINGS

FIG. 1 is a diagram of a computer-based test apparatus according to one embodiment of the present invention.

FIG. 2 is a flow chart of a test sequence performed by the apparatus shown in FIG. 1.

FIG. 3 is a diagram of a software look-up table for storing measurement range information for the apparatus shown in FIG. 1.

FIG. 4 is a diagram illustrating a data log table maintained by the apparatus shown in FIG. 1.

DETAILED DESCRIPTION OF THE PREFERRED EMBODIMENTS

FIG. 1 is a diagram of a computer-based test apparatus which is programmed according to the present invention to automatically range current measurements during DC current testing of an integrated circuit. Test apparatus 10 includes test head 12, computer system 14, user interface 16 and file server 18. Test head 12 includes a receptacle 20 for receiving an integrated circuit (IC) 22 to be tested. Receptacle 20 has electrical connections for coupling to the various pads of IC 22. These pads include power and ground pads and signal input-output (IO) pads. Test head 12 includes a measurement circuit 24 which operates under the control of computer system 14 to apply a voltage across the power and ground pads of IC 22 and measure the resulting current drawn by IC 22 through the power and ground pads. Measurement circuit 24 also applies test vectors to the IO pads of IC 22 under the control of computer system 14.

Computer system 14 supplies control signals and the test vectors to measurement circuit 24 over bus 26, and measurement circuit 24 returns the a measurement value to computer system 14 over bus 26. The measurement value can include an analog signal or a digital signal, depending upon the particular implementation.

Computer system 14 includes processor 30, memory 32 and power supply 34. Power supply 34 provides power to processor 30, memory 32 and test head 12. Processor 30 controls the test sequence by executing software instructions from a test program loaded into memory 32. User interface 16 is coupled to computer system 14 for selecting and initiating a test program, entering test parameters and reviewing test results. User interface 16 can include a keyboard, a mouse or a separate workstation, for example. Test head 12, computer system 14 and user interface 16 are commercially available, and any suitable test system can be used with the present invention. The Credence LT1101 Tester and the Credence Logic 100 Tester, which are available from Credence Systems Corporation, are examples of suitable test systems.

Computer system 14 is coupled to filer server 18 over network 40. File server 18 includes a storage device, such as a disc drive, for storing a test program for each type of IC that will be tested by apparatus 10. Each test program includes the software instructions for performing the test sequence, the test vectors for conditioning the IC, the specification limits for the IC and a table of the measurement ranges available on measurement circuit 24.

FIG. 2 is a flow chart illustrating a test sequence performed by apparatus 10 according to one embodiment of the present invention. At step 50, the test engineer transfers a selected test program from file server 18 to memory 32 over network 40. The test engineer then instructs processor 30 to begin executing the selected test program, at step 52. At step 54, processor 30 generates a control signal which initializes measurement circuit 24 to the lowest measurement range. At step 56, processor 30 instructs measurement circuit 24 to apply a voltage across the power supply pads of IC 22 and provides the test vectors specified in the selected test program to measurement circuit 24. Measurement circuit 24 applies the test vectors to the IO pads of IC 22, which place IC 22 in a quiescent state. In the quiescent state, all sources of DC current in IC 22 are shut off, and all transistors are set to a known state. After IC 22 has been conditioned, measurement circuit 24 measures the resulting current X that is drawn through the power supply pads of IC 22, at step 58. Test head 12 provides the measured value X to processor 30 over bus 26.

At step 60, processor 30 determines whether the measured value X is in the selected measurement range. In a preferred embodiment, the test program executed by processor 30 maintains a software look-up table in memory 32 which stores the minimum and maximum current values in each measurement range of measurement circuit 24. For example, FIG. 3 is a schematic representation of a software look-up table 62 according to one embodiment of the present invention. Processor 30 determines whether the measured value X is in the selected measurement range by retrieving the maximum current of the selected range from table 62 and comparing that value to the measured value X. If the measured value X is equal to or greater than the maximum current value in the selected measurement range, the measured value X is considered to be outside the range. In an alternative embodiment, measurement circuit 24 sets a hardware or software flag or generates some other control signal indicating that the measured value X is outside the selected range. This signal is provided to processor 30.

Referring back to FIG. 2, if the measured value X is outside the selected range, processor 30 increments the selected range to the next higher range, at step 64. The test sequence then returns to step 56. Measurement circuit 24 again applies a voltage across the power supply pads of IC 22 and conditions IC 22 by applying the test vectors to the IO pads. Alternatively, the test sequence returns directly to step 58 from step 64, as shown by the dashed line in FIG. 2. At step 58, measurement circuit 24 measures the DC current drawn by IC 22, and this measurement is made at the new measurement range. The measured value X is provided to processor 30 over bus 26, and processor 30 compares this value to the maximum current in the new measurement range. If the measured value X is greater than or equal to the maximum current in the range, processor 30 again increments the measurement range at step 64. This process repeats until the measured DC current is within the selected measurement range.

When the measured DC current is within the selected measurement range, processor 30 logs the measured value X in memory 32, at step 66. FIG. 4 is a schematic representation of a software data log table maintained in memory 32 for logging the measured DC current value for each IC 22 that is tested. Alternatively, processor 30 can log the measured DC current value in an internal register within the processor. Processor 30 compares the logged, measured value X with a specification limit for IC 22, at step 68. If the measured value X is greater than the specification limit, processor 30 generates an output signal indicating that IC 22 has failed the test, and IC 22 is rejected, at step 70. The output signal can include a message field on a display coupled to computer system 14, a pass/fail indicator light or a message on a computer printout, for example.

If the measured DC current value is less than the specification limit for IC 22, processor 30 generates a pass output signal at step 72, and the test procedure continues with any other tests to be performed by apparatus 10 at step 74. When all tests have been completed, IC 22 is removed and replaced with another IC to be tested, at step 76. Test procedure then returns to step 52 to begin another current measurement test.

The computer-based measurement apparatus and method of the present invention quickly capture the most accurate current measurements during DC current testing of integrated circuits by starting from the lowest measurement range available on the tester and automatically increasing to the most appropriate measurement range. This procedure is particularly useful during characterization and engineering evaluation of an integrated circuit, which is commonly referred to as "data logging". This procedure can also be useful during production testing if precision current measurements are essential. The accuracy of the current measurements is improved substantially since only the correct measurement range is used at the conclusion of the test. The test program automatically ranges the measurement circuit to obtain the most accurate measurements that can be taken by a particular tester. The time required to obtain an accurate measurement is significantly reduced since manual changes to the test program are not necessary to change the measurement range. Also, if vast amounts of accurate DC current measurements are required, engineering time will be saved since only the correct measurements are collected. "Out of range" measurements will never be collected.

Although the present invention has been described with reference to preferred embodiments, workers skilled in the art will recognize that changes may be made in form and detail without departing from the spirit and scope of the invention. For example, the test sequence can be implemented in software, hardware or a combination of both.

What is claimed is:

1. A method of measuring DC current drawn by an integrated circuit, the method comprising:

coupling the integrated circuit to a computer-based test apparatus which has a plurality of current measurement ranges;

maintaining a software look-up table in a memory which includes an entry indicating a maximum current value for each of the plurality of measurement ranges;

initializing the computer-based test apparatus to a selected measurement range in the plurality of measurement ranges;

measuring the DC current drawn by the integrated circuit with the computer-based test apparatus in the selected measurement range;

comparing the measured DC current to the maximum current value entry in the look-up table for the selected measurement range;

incrementing the selected measurement range if the measured DC current is out of the selected measurement range, based on the comparison; and repeating the steps of measuring and incrementing until the measured DC current is in the selected measurement range.

2. The method of claim 1 wherein the step of initializing comprises initializing the computer-based test apparatus to a lowest measurement range in the plurality of measurement ranges.

3. The method of claim 1 wherein the step of incrementing comprises increasing the selected measurement range to a next higher measurement range in the plurality of measurement ranges.

4. The method of claim 1 and further comprising:

comparing the measured DC current to a specification limit for the integrated circuit with the computer-based test apparatus when the measured DC current is in the selected measurement range; and generating an output signal indicative of the comparison.

5. The method of claim 4 wherein the specification limit represents a current level above which the integrated circuit is considered to be defective and wherein the step of generating an output signal comprises generating a pass output signal if the measured DC current is less than the threshold level and generating a fail output signal if the measured DC current exceeds the threshold level.

6. The method of claim 1 and further comprising logging the measured DC current when the measured DC current is in the selected measurement range.

7. The method of claim 1 and further comprising:
applying electrical power to the integrated circuit; and
applying test vectors to the integrated circuit to place the integrated circuit in a desired state prior to measuring the DC current drawn by the integrated circuit.

8. The method of claim 1 and further comprising:
removing the integrated circuit from the computer-based test apparatus after the measured DC current is in the selected measurement range; and
coupling another integrated circuit to the computer-based test apparatus and repeating the steps of initializing, measuring, logging, incrementing and removing.

9. A computer-based DC current test apparatus comprising:

a test head having a receptacle for electrically coupling to an integrated circuit;

a DC current measurement circuit electrically coupled to the test head and having a plurality of measurement ranges;

a processor electrically coupled to the DC current measurement circuit;

a storage device electrically coupled to the processor; and software means stored in the storage device and operative on the processor for:

maintaining a software look-up table in the storage device which includes an entry for each of the plurality of measurement ranges, each entry specifying the maximum current level in that measurement range; and initializing the DC current measurement circuit to a selected measurement range in the plurality of measurement ranges;

measuring the DC current drawn by the integrated circuit with the DC current measurement circuit in the selected measurement range;

comparing the measured DC current to the maximum current level specified in the look-up table for the selected measurement range;

incrementing the selected measurement range if the measured DC current is out of the selected measurement range, based on the step of comparing; and repeating the steps of measuring, comparing and incrementing until the measured DC current is in the selected measurement range.

10. The computer-based test apparatus of claim 9 wherein the software means is further operative on the processor for logging the measured DC current in the storage device when the measured DC current is in the selected measurement range.

11. The computer-based test apparatus of claim 9 wherein the software means is further operative on the processor for comparing the measured DC current to a specification limit when the measured DC current is in the selected measurement range.

12. The computer-based test apparatus of claim 11 wherein the software means is further operative on the processor for generating a pass output signal when the measured DC current is less than the specification limit and a fail output signal when the measured DC current exceeds the specification limit.

13. The computer-based test apparatus of claim 9 wherein:

the DC current measurement circuit comprises means for applying electrical power to the integrated circuit electrically coupled through the test head; and the software means is operable on the processor for applying test vectors to the integrated circuit to place the integrated circuit in a desired state prior to measuring the DC current drawn by the integrated circuit.

14. A computerized method of measuring DC current drawn by an integrated circuit, the method comprising:

coupling the integrated circuit to a computer-based test apparatus which has a plurality of current measurement ranges;

initializing the computer-based test apparatus to a selected measurement range, which is the lowest measurement range in the plurality of measurement ranges, through a software program that is operable on the computer-based test apparatus;

measuring the DC current drawn by the integrated circuit with the computer-based test apparatus in the selected measurement range;

generating a range signal indicative of whether the measured DC current is in or out of the selected measurement range;

detecting the range signal with the software program;

responsively logging the measured DC current through the software program if the range signal indicates the measured DC current is in the selected measurement range;

responsively incrementing the selected measurement range through the software program if the range signal indicates the measured DC current is out of the selected measurement range;

repeating the steps of measuring, generating and incrementing through the software program until the measured DC current is in the selected measurement range;

comparing the logged, measured DC current to a specification limit for the integrated circuit through the software program with the computer-based test apparatus; and generating an output signal indicative of the comparison.

15. The computerized method of claim 14 and further comprising:

maintaining a software look-up table in a memory which includes an entry indicating a maximum current value for each of the plurality of measurement ranges, and wherein the step of generating a range signal comprises comparing the measured DC current to the maximum current value entry in the look-up table for the selected measurement range and outputing the range signal as a function of the comparison.

16. The computerized method of claim 14 wherein:

the step of generating a range signal comprises setting a flag output by the computer-based test apparatus when the computer-based test apparatus detects that the measured DC current is out of the selected measurement range; and the step of responsively incrementing comprises detecting when the computer-based test apparatus sets the flag output through a software program and responsively incrementing the selected measurement range of the computer-based test apparatus with the software program if the flag output is set.

* * * * *